United States Patent [19]
Kenjiro et al.

[11] Patent Number: 6,057,271
[45] Date of Patent: May 2, 2000

[54] METHOD OF MAKING A SUPERCONDUCTING MICROWAVE COMPONENT BY OFF-AXIS SPUTTERING

[75] Inventors: Higaki Kenjiro; Tanaka Saburo; Itozaki Hideo; Yazu Shuji, all of Itami, Japan

[73] Assignee: Sumitomo Electric Industries, Ltd., Japan

[21] Appl. No.: 08/484,093

[22] Filed: Jun. 7, 1995

Related U.S. Application Data

[62] Division of application No. 08/349,142, Nov. 16, 1994, abandoned, which is a continuation of application No. 08/117,381, Sep. 7, 1993, abandoned, which is a continuation of application No. 07/631,613, Dec. 21, 1990, abandoned.

[30] Foreign Application Priority Data

| Dec. 22, 1989 | [JP] | Japan | 1-334032 |
| Jan. 6, 1990 | [JP] | Japan | 2-876 |
| Nov. 13, 1990 | [JP] | Japan | 2-306733 |

[51] Int. Cl.$^7$ .............................. H01L 39/24; C23C 14/34

[52] U.S. Cl. .............................................................. 505/475

[58] Field of Search .................................... 505/202, 210, 505/238, 475, 731; 428/930; 204/192.24

[56] References Cited

PUBLICATIONS

Braggins et al, Adv. Cryog. Eng., 38(Pt.B) 1992, pp. 1013–1018.
Hedges et al, Electron. Lett., 27(25) 1991, pp. 2312–2313.

*Primary Examiner*—Roy V. King
*Attorney, Agent, or Firm*—Pennie & Edmonds LLP

[57] ABSTRACT

A microwave component includes a single dielectric layer, and one pair of conductor layers formed on opposite surfaces of the dielectric layer, respectively, one of the pair of conductor layers forming a ground conductor, and the other of the pair of conductor layers being shaped in a predetermined pattern. The pair of conductor layers are respectively formed of oxide superconductor material layers which are deposited by off-axis sputtering on the opposite surfaces of the dielectric layer, respectively, and which have little defect.

2 Claims, 5 Drawing Sheets

METHOD OF MAKING A SUPERCONDUCTING MICROWAVE COMPONENT BY OFF-AXIS SPUTTERING

This application is a divisional application of 08/349,142, filed Nov. 16, 1994, now abandoned, which is a continuation application of 08/117,381, filed Sep. 7, 1993, now abandoned, which is a continuation application of 07/631,613, filed Dec. 21, 1990, now abandoned.

BACKGROUND OF THE INVENTION

1. Field of the Invention

The present invention relates to microwave components, and particularly to superconduction microwave components such as microwave resonators and microwave delay lines, which are passive components for handling electromagnetic waves having a very short wavelength such as microwaves and millimetric waves, and which have conductor layers formed of oxide superconductor materials. More specifically, the present invention relates to a novel method for fabricating a substrate which can be used for fabricating microwave components having conductor layers formed of oxide superconductor thin films.

2. Description of Related Art

Microwaves and millimetric waves are characterized by a straight-going property of radio waves, reflection by a conduction plate, diffraction due to obstacles, interference between radio waves, optical behavior when passing through a boundary between different mediums, and others. In addition, some physical phenomena which was too small in effect and therefore could not be utilized in practice will remarkably appear in the microwaves and millimetric waves. For example, there are now actually used an isolator and a circulator utilizing a gyro magnetic effect of a ferrite, and medical instruments such as plasma diagnosis instrument utilizing interference between a gas plasma and a microwave. Furthermore, since the frequency of the microwaves and millimetric waves is extremely high, the microwaves and millimetric waves have been used as a signal transmission means of a high speed and a high density.

In the case of propagating an electromagnetic wave in frequency bands which are called the microwave and the millimetric wave, a twin-lead type feeder used in a relative low frequency band has an extremely large transmission loss. In addition, if an inter-conductor distance approaches a wavelength, a slight bend of the transmission line and a slight mismatch in connection portion cause reflection and radiation, and is easily influenced from adjacent objects. Thus, a tubular waveguide having a sectional size comparable to the wavelength has been actually used. The waveguide and a circuit constituted of the waveguide constitute a three-dimensional circuit, which is larger than components used in ordinary electric and electronic circuits. Therefore, application of the microwave circuit has been limited to special fields.

However, miniaturized devices composed of semiconductor have been developed as an active element operating in a microwave band. In addition, with advancement of integrated circuit technology, a so-called microstrip line having a extremely small inter-conductor distance has been used.

In 1986, Bednorz and Muller discovered $(La, Ba)_2CuO_4$ showing a superconduction state at a temperature of 30 K. In 1987, Chu discovered $YBa_2Cu_3O_y$ having a superconduction critical temperature on the order of 90 K, and in 1988, Maeda discovered a so-call bismuth (Bi) type compound oxide superconductor material having a superconduction critical temperature exceeding 100 K. These compound oxide superconductor materials can obtain a superconduction condition with cooling using an inexpensive liquid nitrogen. As a result, possibility of actual application of the superconduction technology has become discussed and studied.

Phenomenon inherent to the superconduction can be advantageously utilized in various applications, and the microwave component is no exceptions. In general, the microstrip line has an attenuation coefficient that is attributable to a resistance component of the conductor. This attenuation coefficient attributable to the resistance component increases in proportion to a root of a frequency. On the other hand, the dielectric loss increases in proportion to increase of the frequency. However, the loss in a recent microstrip line is almost attributable to the resistance of the conductor, since the dielectric materials have been improved. Therefore, if the resistance of the conductor in the strip line can be reduced, it is possible to greatly elevate the performance of the microstrip line.

As well known, the microstrip line can be used as a simple signal transmission line. However, if a suitable patterning is applied, the microstrip line can be used as an inductor, a filter, a resonator, a delay line, a directional coupler, and other passive microwave circuit elements that can be used in a hybrid circuit.

The microstrip line is generally constituted of a pair of conductors separated from each other by an dielectric material layer, one of the conductor being grounded.

Here, considering a substrate which can be used for fabricating a microstrip line having conductors formed of oxide superconductor material, it could be estimated that the substrate comprises a plate formed of a dielectric material and a pair of oxide superconduction material thin films deposited on opposite surfaces of the dielectric plate, respectively. If this substrate is given or available, a superconduction microwave component having a predetermined pattern of conductor formed on one surface of a dielectric plate and a grounded conductor formed on the other surface of the dielectric plate, can be easily fabricated by suitably patterning one of the pair of oxide superconduction material thin films.

However, it is very difficult to form the above mentioned substrate for the microwave component, by a process of depositing an oxide superconduction thin film on one surface of a dielectric plate, and thereafter depositing another oxide, superconduction thin film on the other surface of the dielectric plate.

The reason for this is as follows: First, the oxide superconduction thin film can be obtained only when a film of oxide superconductor material is deposited on a specific; substrate under a specific deposition condition. Secondly, since oxygen contained in the oxide superconductor material is unstable, if the deposited oxide superconductor material is heated, the content of the oxygen will change. Therefore, in the process of sequentially depositing an oxide superconduction thin film on one or first surface of a dielectric plate, and thereafter on the other or second surface of the dielectric plate, the superconductor characteristics of the oxide superconduction thin film deposited on the first surface of a dielectric plate is deteriorated when the oxide superconduction thin film is deposited on the second surface of a dielectric plate. Because of this, it has been considered to difficult to prepare a substrate for microwave component having superconduction thin film of good characteristics uniformly formed on opposite surfaces of the substrate.

SUMMARY OF THE INVENTION

Accordingly, it is an object of the present invention to provide a high performance microwave component having oxide superconductor material layers of a good superconduction characteristics formed on opposite surfaces of a substrate.

Another object of the present invention is to provide a method for fabricating a substrate for superconduction microwave component having oxide superconductor material layers of a good superconduction characteristics formed on opposite surfaces of a substrate.

The above and other objects of the present invention are achieved in accordance with the present invention by a microwave component including a, dielectric layer, and at least one pair of conductor layers formed on opposite surfaces of the dielectric layer, respectively, one of the at least one pair of conductor layers forming a ground conductor, and the other of the at least one pair of conductor layers being shaped in a predetermined pattern, the at least one pair of conductor layers being respectively formed of oxide superconductor material layers which are deposited on the opposite surfaces of the dielectric layer, respectively and which have little defect.

Typically, the above mentioned microwave component includes a microwave resonator and a microwave delay line.

Preferably, the at least one pair of conductor layers are formed in the form of a thin film deposited under a condition in which a substrate temperature does not exceed 800° C. throughout a whole process from a beginning until a termination.

A substrate for superconduction microwave- component that includes one pair of oxide superconductor thin films respectively formed on opposite surfaces of the substrate, can be fabricated by using a deposition apparatus which includes a substrate holder for holding the substrate in such a manner that deposition surfaces of the substrate are positioned perpendicularly to a horizontal plane, a target holder for holding a target in such a manner that the target is positioned perpendicularly to the deposition surfaces of the substrate held by the substrate holder, and heating means located at a side position of the deposition surfaces of the substrate held by the substrate holder so as not to interrupt between the deposition surfaces of the substrate and the target held by the target holder, so that oxide superconductor thin films are simultaneously deposited on opposite deposition surfaces of the substrate, respectively.

The conductors included in the microwave component in accordance with the present invention are constituted of the conductor shaped in the predetermined pattern and the ground conductor formed separately from the patterned signal conductor, and both of the patterned conductor and the ground conductor are formed of the oxide superconductor thin films which are deposited on opposite surfaces of the dielectric layer, respectively, and which have a good superconductivity substantially equally to each other. Since both of these conductors are formed of the oxide superconductor thin films having a good superconduction characteristics, propagation loss in a microwave line constituting the microwave component is remarkably reduced, and a usable frequency band is expanded towards a high frequency side. In addition, since the conductor is formed of the oxide superconductor material, the superconduction condition can be realized by use of inexpensive liquid nitrogen, and therefore, the microwave component of a high performance can be used in increased fields of application.

The above mentioned at least one pair of conductor layers are formed of the same compound oxide superconductor material. In this case, the above mentioned at least one pair of conductor layers have a good superconduction characteristics substantially equally to each other. However, the at least one pair of conductor layers can be formed of different compound oxide superconductor materials. In this case, the at least one pair of conductor layers cannot in some case have a good superconduction characteristics substantially equally to each other, since the different oxide superconductor materials have different critical temperature and/or critical current current. However, it can be at least said that at least one pair of conductor layers formed of different compound oxide superconductor materials have a good superconductivity quality substantially comparable to each other.

Furthermore, the substrate for microwave component in accordance with the present invention is characterized in that the oxide superconductor thin films are simultaneously deposited on opposite surfaces of the dielectric substrate, respectively.

Since the oxide superconductor thin films are simultaneously deposited on opposite surfaces of the dielectric substrate, respectively, none of the deposited oxide superconductor thin films is exposed to a bad environment such a heat, electron bombardment and others. Therefore, the oxide superconductor thin films having a good and uniform characteristics can be deposited on both of opposite surfaces of the dielectric substrate, respectively.

The oxide superconductor thin films constituting the conductor layers can be deposited by any one of various known deposition methods. However, in the case of forming the oxide superconductor thin films used as the conductor layers of the microwave component, it is necessary to pay attention so as to ensure that a boundary between the dielectric layer and the oxide superconductor thin films is maintained in a good condition. Namely, in the microwave components, an electric current flows at a surface of the conductor layer, and therefore, if the surface of the conductor layer is disturbed in a physical shape and in an electromagnetic characteristics, a merit obtained by using the oxide superconductor material for the conductor layer would be lost. In addition, if the dielectric layer is formed of $Al_2O_3$ or $SiO_2$, it is in some case that $Al_2O_3$ or $SiO_2$ reacts with the compound oxide superconductor material by a necessary heat applied in the course of the oxide superconductor film depositing process, with the result that the superconduction characteristics of a signal conductor is deteriorated or lost The matters to which attention should be paid at the time of depositing the oxide superconductor material are: (1) The material of the oxide superconductor material and the material of the dielectric layer or substrate have a less reactivity to each other; and (2) a treatment which causes the materials of the oxide superconductor layer and the dielectric layer to diffuse to each other, for example, a heating of the substrate to a high temperature in the course of deposition and after the deposition, should be avoided to the utmost. Specifically, it is necessary to pay attention so as ensure that the temperature of the substrate in no way exceeds 800° C. in the process of the oxide superconductor material deposition.

From the viewpoint as mentioned above, an off-axis sputtering or a laser evaporation are convenient, since there is less restriction to the substrate temperature in the course of the deposition and therefore it is possible to easily and freely control the substrate temperature. In addition, a so-called post-annealing performed after deposition is not convenient not only in the above deposition processes but also in other deposition processes. Therefore, it is important to select a deposition process ensuring that an as-deposited oxide superconductor material layer has already assumed a superconduction property without treatment after deposition.

The dielectric layer can be formed of any one of various known dielectric materials. For example, $SrTiO_3$ and YSZ are greatly advantageous from only a viewpoint of depositing the superconductor thin film. However, a very large dielectric loss of these material would cancel a benefit of a decreased conductor loss obtained by using the superconductor. Therefore, in order to improve the characteristics of the microwave line, it is advantageous to use a material having a small dielectric loss, for example, $Al_2O_3$, $LaAlO_3$, $NdGaO_3$, MgO and $SiO_2$. Particularly, $LaAlO_3$ is very convenient, since it is stable until reaching a considerably high temperature and is very low in reactivity to the compound oxide superconductor material, and since it has a small dielectric loss that is one-tenth or less of that of $SrTiO_3$ and YSZ. In addition, as the substrate which has a small dielectric loss and on which the oxide superconductor material can be deposited in a good condition, it is possible to use a substrate obtained by forming, on opposite surfaces of a dielectric plate such as a sapphire and $SiO_2$ having a extremely small dielectric loss, a buffer layer which makes it possible to deposit the oxide superconductor material in a good condition For forming the patterned signal conductor and the ground conductor in the microwave component, a yttrium (Y) system compound oxide superconductor material and a compound oxide superconductor material including thallium (Tl) or bismuth (Bi) can be exemplified as the oxide superconductor material which has a high superconduction critical temperature and which becomes a superconduction condition with a liquid nitrogen cooling. However, the oxide superconductor material for forming the patterned conductor and the ground conductor in the microwave component is not limited to these materials.

The compound oxide superconductor material layer deposited on a whole surface of the substrate can be patterned by a wet etching using a hydrochloric acid or other etching agents.

In the case that a microwave resonator is constituted of the microwave component in accordance with the present invention, the microwave resonator can be in the form of a linear resonator which is formed of rectangular conductor layers having a predetermined width and a predetermined length, or in the form of a circular disc resonator or a ring resonator which is constituted of a circular conductor having a predetermined diameter.

Furthermore, in the case that a microwave delay line is constituted of the microwave component in accordance with the present invention, the microwave delay line having a desired characteristics can be formed by suitably patterning the conductor layer formed on one surface of the dielectric layer. Namely, the delay line can be realized by causing the microwave line to have a desired or predetermined inductance component, and therefore, by suitably designing the width and the length of the patterned signal conductor in the case of the microstrip line.

The above and other objects, features and advantages of the present invention will be apparent from the following description of preferred embodiments of the invention with reference to the accompanying drawings. However, the examples explained hereinafter are only for illustration of the present invention, and therefore, it should be understood that the present invention is in no way limited to the following examples.

DESCRIPTION OF THE PREFERRED EMBODIMENTS

Figure 1:
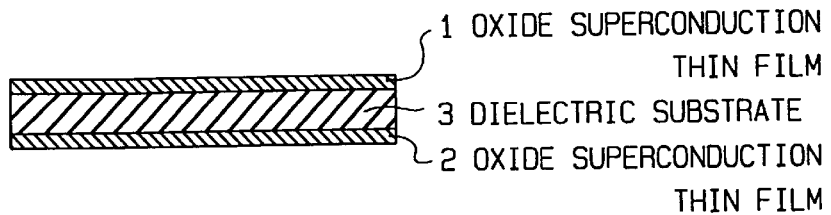
FIG. 1 is a diagrammatic sectional view of a substrate for superconduction microwave component which can be fabricated in accordance with the present invention.

As shown FIG. 1, a substrate for superconduction microwave component in accordance with the present invention includes a pair of oxide superconductor thin films 1 and 2 deposited on opposite surfaces of a single dielectric substrate 3, respectively.

If the substrate shown in FIG. 1 is given, a microwave component can be fabricated by patterning one of the oxide superconductor thin films 1 and 2.

Figure 2A:
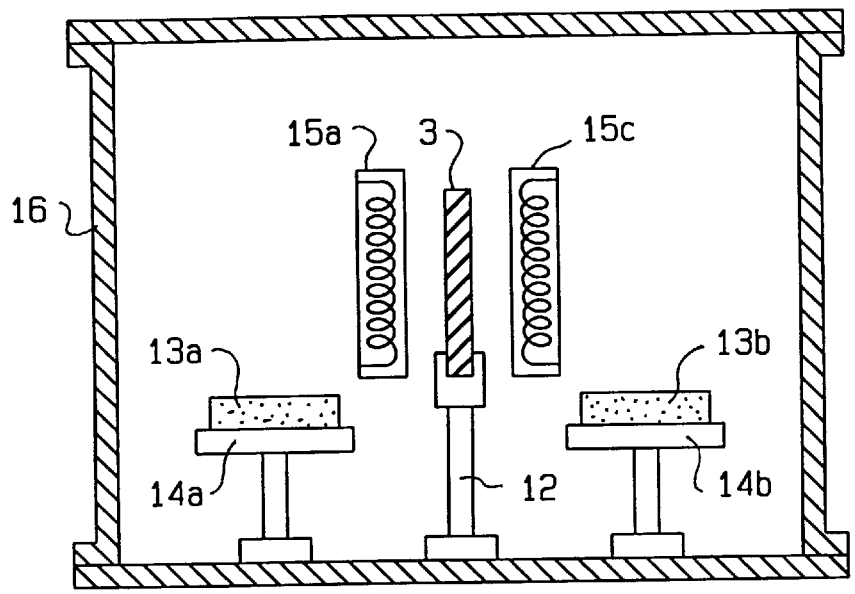
FIG. 2A is a diagrammatic vertical sectional view of a deposition apparatus which can embody the method in accordance with the present invention.
Figure 2B:
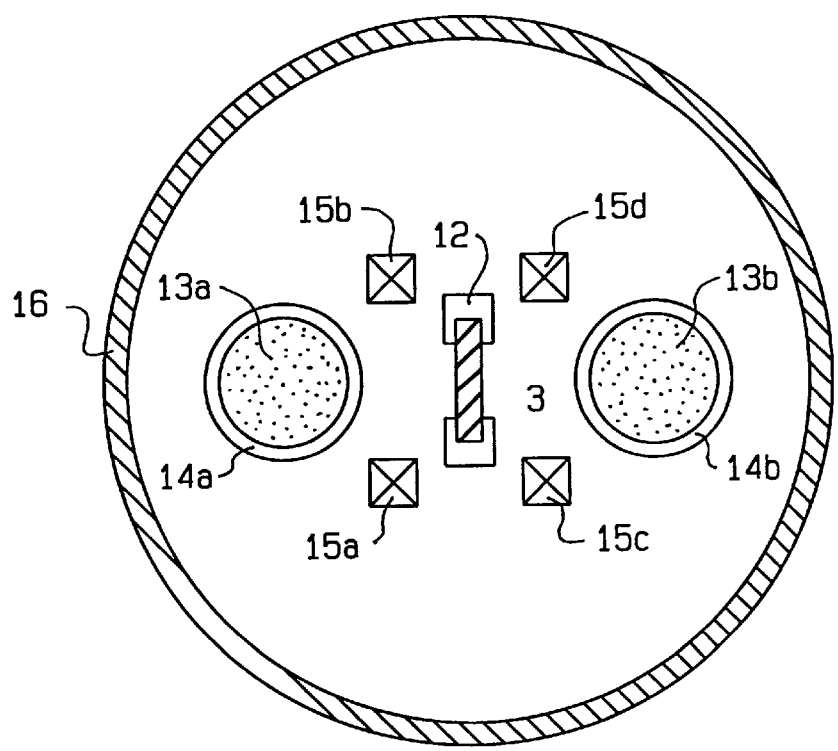
FIG. 2B is a diagrammatic horizontal sectional view of the deposition apparatus shown in FIG. 2B.

FIGS. 2A and 2B illustrates a deposition apparatus which can embody the method in accordance with the present invention for fabricating the substrate for microwave component. FIG. 2A is a diagrammatic vertical sectional view of the deposition apparatus and FIG. 2B is a diagrammatic horizontal sectional view of the deposition apparatus.

As shown in FIGS. 2A and 2B, the deposition apparatus includes includes a substrate holder 12 for holding the substrate 3 in such a manner that opposite deposition surfaces of the substrate are positioned perpendicularly to a horizontal plane, a pair of target holders 14a and 14b located at a side position of the substrate holder 12 and each for holding one target 13a or 13b, and two pairs of heaters 15a to 15d located at a side position of the substrate holder 12. The substrate holder 12, the target holders 14a and 14b and the heaters 15a to 15d are located within a chamber 16.

The substrate holder 12 is constructed to grasp only a portion of a side surface of the substrate 3 and a portion of a periphery of deposition surfaces of the substrate 3, so that a substantial portion of each of opposite deposition surfaces of the substrate 3 is not covered by the substrate holder 12. The target holders 14a and 14b are designed to hold the target 13a or 13b in such a manner that the target 13a or 13b is positioned perpendicularly to the deposition surfaces of the substrate 3 held by the substrate holder. The heaters 15a to 15d are located at a position offset sideward from the front of the each opposite deposition surface of the substrate 3, so that the substrate 3 is heated by the offset position without interrupting between the deposition surfaces of the substrate and the target held by the target holder.

By using the above mentioned deposition apparatus, oxide superconductor thin films can be simultaneously deposited on a pair of opposite deposition surface of the single substrate 3 while heating the pair of opposite deposition surface of the substrate 3.

EXAMPLE 1

A substrate for superconduction microwave component was actually fabricated using the deposition apparatus shown in FIG. 2.

A $LaAlO_3$ substrate having a thickness of 0.5 mm, a width of 15 mm and a length of 15 mm was used as the dielectric substrate 3. A Y-Ba-Cu-O type compound superconductor material was selected as the oxide superconductor material, and was deposited by sputtering. The deposition condition was as follows:

Target: $YaBa_2Cu_3Oy$

Sputtering gas: Ar containing 20% Of $O_2$

Gas pressure: 0.5 Torr

Substrate Temperature: 600° C.

Film thickness: 4000 Å

The heater was a tungsten halogen lamp.

In the thus formed substrate for microwave component having the oxide superconductor thin film formed on each of opposite surfaces thereof, the characteristics of the oxide superconductor thin film formed on each of the opposite surfaces was measured. The result of the measurement is shown in the following:

|  | Critical temperature (K) | Critical current density (A/cm$^2$) |
| --- | --- | --- |
| First surface (front) | 85 | 1.1 × 10$^6$ |
| Second surface (back) | 85 | 1.3 × 10$^6$ |

As seen from the above, in the substrate for microwave component fabricated in accordance with the present invention, the oxide superconductor thin films respectively, formed on the opposite surfaces of the substrate have a substantially uniform superconduction characteristics.

EXAMPLE 2

A substrate for superconduction microwave component was actually fabricated using the same deposition apparatus as that used in the Example 1.

A MgO substrate has the same size as that of the substrate used in the Example 1. A Y-Ba-Cu-O type compound superconductor material was selected as the oxide superconductor material, and was deposited by sputtering. The deposition condition was as follows:

Target: $YaBa_2Cu_3Oy$

Sputtering gas: Ar containing 20% of $O_2$

Gas pressure: 0.5 Torr

Substrate Temperature: 620° C.

Film thickness: 4000 Å

In the thus formed substrate for microwave component having the oxide superconductor thin film formed on each of opposite surfaces thereof, the characteristics of the oxide superconductor thin film formed on each of the opposite surfaces was measured. The result of the measurement is shown in the following:

|  | Critical temperature (K) | Critical current density (A/cm$^2$) |
| --- | --- | --- |
| First surface (front) | 85 | 1.5 × 10$^6$ |
| Second surface (back) | 86 | 1.6 × 10$^6$ |

As seen from the above, in the substrate for microwave component fabricated in accordance with the present invention, the oxide superconductor thin films respectively formed on the opposite surfaces of the substrate have a substantially uniform superconduction characteristics.

EXAMPLE 3

A substrate for superconduction microwave component was actually fabricated using the same deposition apparatus as that used in the Example 1 and using a MgO substrate and a bismuth type compound superconductor material. The MgO substrate has the same size as that of the substrate used in the Example 1. The bismuth type compound superconductor material was deposited by sputtering. The deposition condition was as follows:

Target: $Bi_3Sr_2Ca_2Cu_3Oz$

Sputtering gas: Ar containing 20% of $O_2$

Gas pressure: 0.1 Torr

Substrate Temperature: 650° C.

Film thickness: 3000 Å

In the thus formed substrate for microwave component having the oxide superconductor thin film formed on each of opposite surfaces thereof, the characteristics of the oxide superconductor thin film formed on each of the opposite surfaces was measured. The result of the measurement is shown in the following:

|  | Critical temperature (K) | Critical current density (A/cm$^2$) |
| --- | --- | --- |
| First surface (front) | 92 | 3.8 × 10$^5$ |
| Second surface (back) | 90 | 3.6 × 10$^5$ |

As seen from the above, in the substrate for microwave component fabricated in accordance with the present invention, the oxide superconductor thin films respectively formed on the opposite surfaces of the substrate have a substantially uniform superconduction characteristics.

As seen from the above description, the method in accordance with the present invention can form a substrate for microwave component which includes a single substrate and a pair of oxide superconductor thin films respectively formed on the opposite surfaces of the substrate and having a substantially uniform and good superconduction characteristics.

The substrate fabricated in accordance with the present invention can be easily worked into various kinds of microwave component by suitably patterning one of the pair of oxide superconductor thin films respectively formed on the opposite surfaces of the substrate. The microwave component has a low transmission loss and a widened frequency band, since it has a conductor formed of the oxide superconductor thin film having a good superconduction characteristics.

Now, embodiments of the microwave components fabricated by using the substrate for superconduction microwave component formed in accordance with the above mentioned methods will be described

EMBODIMENT 1

A microwave resonator which includes a dielectric layer composed of a $LaAlO_3$ substrate and conductor layers formed of $YBa_2Cu_3O_y$ thin film was fabricated.

Figure 3A:
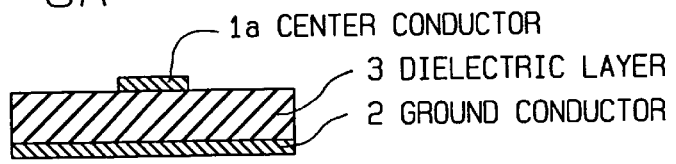
FIG. 3A is a diagrammatic sectional view of one embodiment of the superconduction microwave component in accordance with the present invention.
Figure 3B:
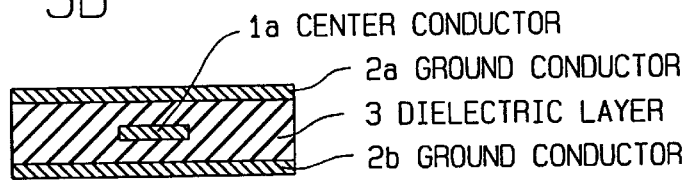
FIG. 3B is a diagrammatic sectional view of another embodiment of the superconduction microwave component in accordance with the present invention.

Referring to FIGS. 3A and 3B, there are shown sectional structures of microwave transmission lines which can constitute the microwave resonator in accordance with the present invention.

A microwave transmission line shown in FIG. 3A is a so called microstrip line which includes a dielectric layer 3, a center signal conductor 1a formed in a desired pattern on an upper surface of the dielectric layer 3, and a ground conductor 2 formed to cover a whole of an undersurface of the dielectric layer 3.

A microwave transmission line shown in FIG. 3B is a so called balanced microstrip line which includes a center signal conductor 1a, a dielectric layer 3 embedding the center signal conductor 1a at a center position, and a pair of ground conductors 2a and 2b formed on upper and under surfaces of the dielectric layer 3, respectively.

In this embodiment, in view of an excellent characteristics of the microwave line, the microwave resonator was fabricated by adopting the structure of the balanced microstrip line shown in FIG. 3B. Namely, the signal conductor 1a and the ground conductors 2a and 2b were formed of the $YBa_2Cu_3O_y$ thin film, and the dielectric layer 3 was formed of $LaAlO_3$.

Figure 4:
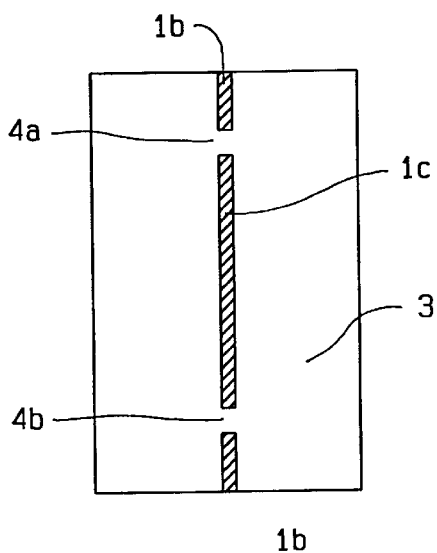
FIG. 4 is a diagrammatic plan view illustrating a patterned signal conductor of a superconduction microwave resonator in accordance with the present invention.

FIG. 4 shows a center signal conductor pattern of the microwave resonator fabricated in accordance with a process which will be described hereinafter.

As shown in FIG. 4, the center signal conductor pattern of the microwave resonator includes a pair of center conductors 1b aligned to each other but separated from each other, and another center conductor 1c located between the pair of center conductors 1b and aligned to the pair of center conductors 1b. The center conductor 1c is separated from the pair of center conductors 1b by gaps 4a and 4b, respectively, and each of the gaps 4a and 4b forms a coupling capacitor. Specifically, each of the center conductors 1b has a width of 0.26 mm and each of the gaps 4a and 4b is 0.70 mm. The pair of center conductors 1b forms a microstrip line having a characteristics impedance of 50 Ω at 10 GHz. On the other hand, the center conductor 1c has a width of 0.26 mm and a length of 8.00 mm.

Referring to FIGS. 5A to 5D, a process of fabricating the embodiment of the microwave resonator in accordance with the present invention is illustrated.

Figure 5A:
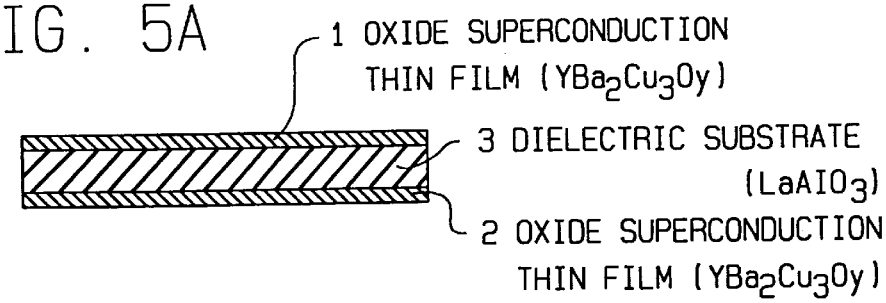
FIGS. 5A, 5B, 5C and 5D are diagrammatic sectional views illustrating various steps of a process for fabricating the microwave resonator in accordance with the present invention.

First, there is prepared a substrate for superconduction microwave component as shown in FIG. 5A which is formed in accordance with the method of the present invention described hereinbefore. A $LaAlO_3$ plate having a thickness of 0.5 mm was used as the dielectric substrate 3. Under the same deposition method and conditions as those of the Example 1 explained hereinbefore, $YBa_2Cu_3O_y$ thin films 1 and 2 of a thickness 6000 Å were simultaneously deposited on an upper surface and an undersurface of the $LaAlO_3$ dielectric substrate 3.

Figure 5B:
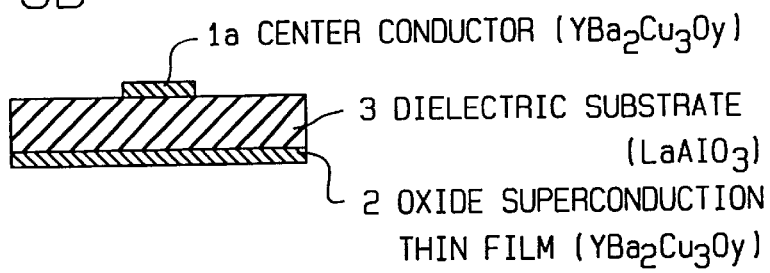
Figure 5C:
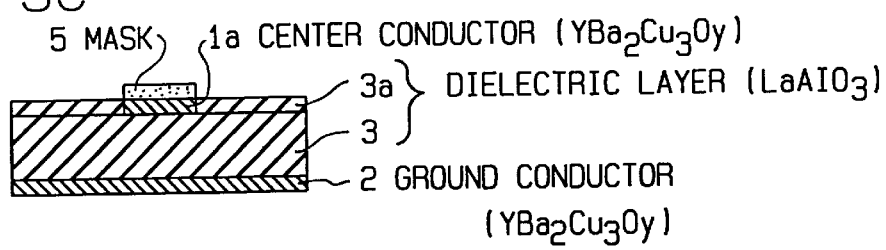

Thereafter, as shown in FIG. 5B, the oxide superconductor thin film 1 was patterned by a wet etching using an etching agent of hydrochloric acid, so that an oxide superconductor thin film 1a patterned as shown in FIG. 4 is formed on the upper surface of the $LaAlO_3$ dielectric substrate 3. Then, as shown in FIG. 5C, only the patterned oxide superconductor thin film 1a was covered with a mask 5, and a $LaAlO_3$ dielectric layer 3a is deposited on the upper surface of the $LaAlO_3$ dielectric substrate 3 excluding the patterned oxide superconductor thin film 1a until the deposited $LaAlO_3$ dielectric 3a becomes the same in thickness as the patterned oxide superconductor thin film 1a. Deposition of the $LaAlO_3$ dielectric layer 3a was performed by an electron beam evaporation process using La and Al (metal) as evaporation sources and under a condition of a gas pressure of $2 \times 10^{-4}$ Torr and a substrate temperature of 600° C.

Figure 5D:
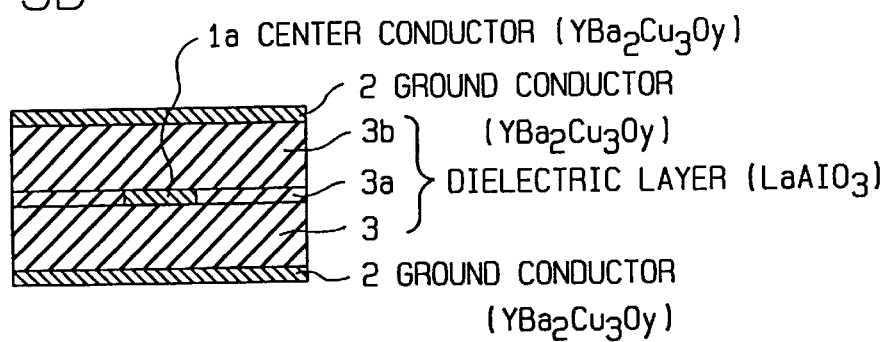

Then, as shown in FIG. 5D, a $LaAlO_3$ dielectric substrate 3b having a $YBa_2Cu_3O_y$ thin film formed on an upper surface thereof as the conductor 2 was overlaid on and adhered to the upper surface of the substrate 3 having the pattered conductor 1a.

Thus, the microwave resonator having the sectional structure shown in FIG. 3B was completed.

Figure 6:
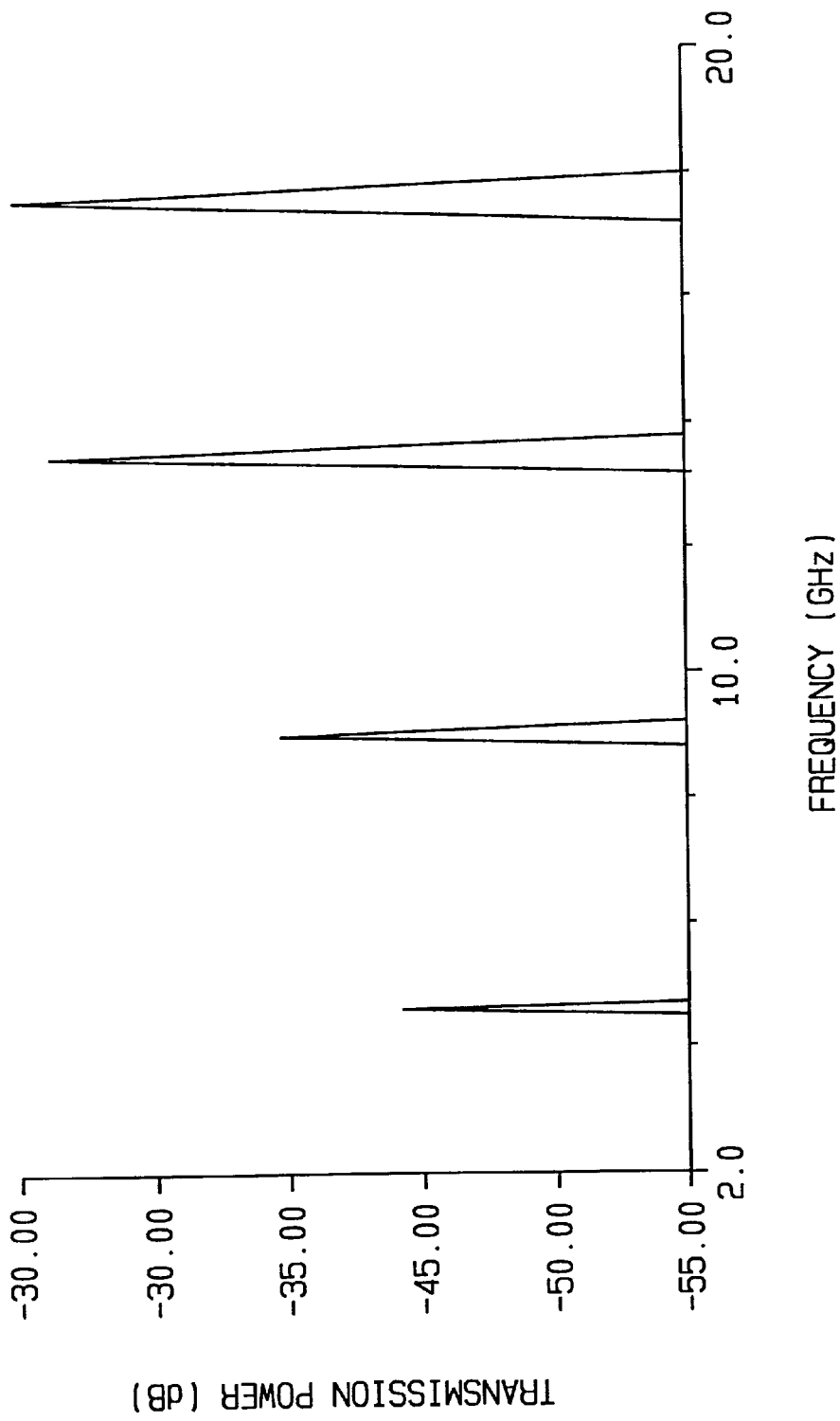
FIG. 6 is a graph illustrating the characteristics of the microwave resonator in accordance with the present invention.

The microwave resonator fabricated as mentioned above was connected to a network analyzer in order to measure a frequency characteristics of a transmission power in a range of 2 GHz to 20 GHz. The result of the measurement is shown in FIG. 6.

To evaluate a frequency selectivity of a microwave resonator, it is an ordinary practice to indicate, as Q factor, a ratio of a resonance frequency "fo" and a band width "B" in which the level of the transmission power does not drop below a level which is lower than a maximum level by 3 dB. (Q=fo/B) In addition, as a comparative example, there was prepared a microwave resonator having the same specification as that of the above mentioned microwave resonator in accordance with the present invention, other than the conductors formed of aluminum. Q factor of the embodiment of the microwave resonator of the present invention and the comparative example was measured. The result of the measurement is shown in TABLE 1.

TABLE 1

| Frequency (GHz) | | 4.6 | 9.1 | 13.4 | 17.7 |
|---|---|---|---|---|---|
| Q | Embodiment | 2050 | 1760 | 1230 | 1080 |
|   | Comparative | 210 | 300 | 370 | 510 |

It is considered that a high Q factor in the microwave resonator of the present invention in comparison with the comparative example is realized by the fact that both of the center signal conductor and the ground conductors have a very low surface or skin resistance. This can be considered to mean that both of the signal conductor and the ground conductors are formed of the oxide superconductor thin films having a good superconductivity substantially equally to each other. In other words, it can be said that all of the oxide superconductor thin films, which constitute the signal conductor and the ground conductors, respectively, have little defect.

As seen from the above, the present invention can give the microwave resonator capable of operating at a liquid nitrogen temperature and having a remarkably high Q factor, since the microwave resonator is formed of a microstrip line having the conductors formed of an oxide superconductor material layer having an excellent superconduction characteristics.

EMBODIMENT 2

A microwave delay line which includes a dielectric layer composed of a $LaAlO_3$ substrate and conductor layers formed of $YBa_2Cu_3O_y$ thin film was fabricated.

A microwave transmission line which can constitute the microwave delay line in accordance with the present invention can have a sectional structure shown in FIGS. 3A and 3B.

In this embodiment, the microwave delay line was fabricated by adopting the structure of the microstrip line shown in FIG. 3A. Namely, the center signal conductor 1a and the ground conductor 2 were formed of the $YBa_2Cu_3O_y$ thin film, and the dielectric layer 3 was formed of $LaAlO_3$.

Figure 7:
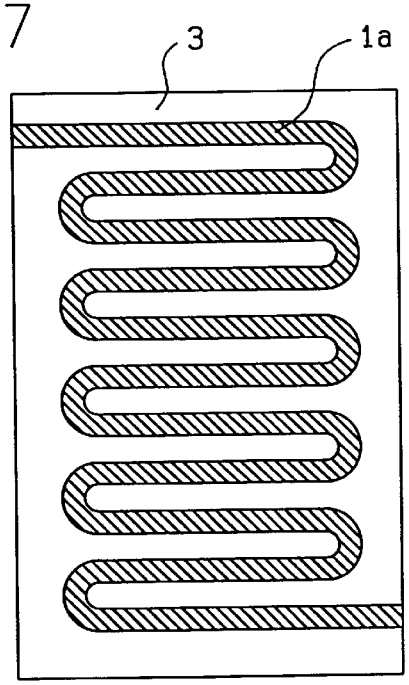
FIG. 7 is a diagrammatic plan view illustrating a patterned signal conductor of a superconduction microwave delay line in accordance with the present invention.

FIG. 7 shows a center signal conductor pattern of the microwave delay line fabricated in accordance with a process which will be described hereinafter.

As shown in FIG. 7, the center signal conductor 1 has a meandering or zigzag pattern. The signal conductor 1a has a width of 280 μm and a length of 63 cm. The signal conductor 1a forms a microstrip line having a characteristics impedance of 50 Ω. A delay time obtained in the microwave delay line was 10 ns when the conductors are in a superconduction condition.

The above microwave delay line in accordance with the present invention was fabricated as follows: First, there is prepared a substrate for superconduction microwave component which is formed in accordance with the method of the present invention described hereinbefore. A $LaAlO_3$ plate having a thickness of 0.5 mm was used as the dielectric substrate 3. Under the same deposition method and conditions as those of the Example 1 explained hereinbefore, $YBa_2Cu_3O_y$ thin films 1 and 2 of a thickness 6000 Å were simultaneously deposited on an upper surface and an undersurface of the $LaAlO_3$ dielectric substrate 3. Thereafter, the oxide superconductor thin film 1 was patterned by a wet etching using an etching agent of hydrochloric acid, so that an oxide superconductor thin film 1a patterned as shown in FIG. 7 is formed on the upper surface of the $LaAlO_3$ dielectric substrate 3.

In addition, as a comparative example, there was prepared a microwave delay line which has a delay time of 10 ns and which is formed of a strip line including a conductor of a 280 μm width composed of an aluminum thin film deposited on a sapphire substrate.

Figure 8:
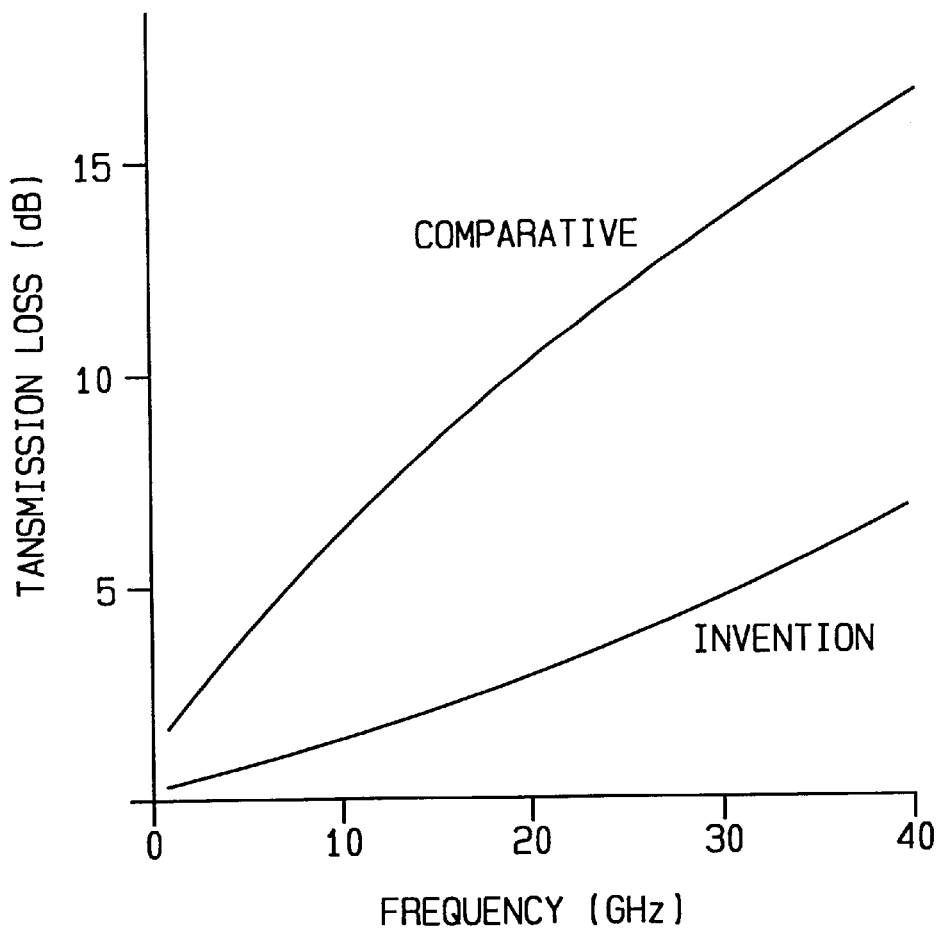
FIG. 8 is a graph illustrating the characteristics of the microwave delay line in accordance with the present invention.

A transmission loss of the embodiment of the microwave delay line of the present invention and the comparative example was measured by inputting a signal of 1 GHz to 40 GHz. The result of the measurement is shown in FIG. 8.

It is considered that a low transmission loss in the microwave delay line of the present invention in comparison with the comparative example is realized by the fact that both of the center or signal conductor and the ground conductor have a very low surface or skin resistance. This can be considered to mean that both of the signal conductor and the ground conductor are formed of the oxide superconductor thin films having a good superconductivity substantially equally to each other. In other words, it can be said that all of the oxide superconductor thin films, which constitute the signal conductor and the ground conductor, respectively, have little defect.

As seen from the above, the present invention can give the microwave delay line capable of operating at a liquid nitrogen temperature and having a small transmission loss, since the microwave delay line is formed of a microstrip line having the conductors formed of an oxide superconductor material having an excellent superconduction characteristics.

The invention has thus been shown and described with reference to the specific embodiments. However, it should be noted that the present invention is in no way limited to the details of the illustrated structures but changes and modifications may be made within the scope of the appended claims.

We claim:

1. A method of making a superconducting microwave component comprising depositing by off-axis sputtering one pair of oxide superconductor thin films, respectively on opposite surfaces of a dielectric substrate by using a sputtering apparatus which comprises a substrate holder for holding said substrate in such a manner that deposition surfaces of said substrate is positioned perpendicularly to a horizontal plane, a target holder for holding a target in such a manner that said target is positioned perpendicularly to said deposition surfaces of said substrate held by said substrate holder, and heating means located at said position of said deposition surfaces of said substrate held by said substrate holder so as not to interrupt between said deposition surfaces of said substrate and said target held by said target holder, so that the oxide superconductor thin films are simultaneously deposited on the opposite deposition surfaces of said substrate, respectively.

2. A method claimed in claim 1, wherein said pair of oxide superconductor films are deposited at a substrate temperature of not greater than 800° C.

* * * * *